(12) United States Patent
Uyama et al.

(10) Patent No.: US 11,081,349 B2
(45) Date of Patent: Aug. 3, 2021

(54) METHOD OF FORMING FILM ON SUBSTRATE AND METHOD OF MANUFACTURING LIQUID EJECTION HEAD

(71) Applicant: CANON KABUSHIKI KAISHA, Tokyo (JP)

(72) Inventors: Masaya Uyama, Kawasaki (JP); Souta Takeuchi, Fujisawa (JP); Taichi Yonemoto, Isehara (JP); Kazuaki Shibata, Kawasaki (JP); Atsushi Teranishi, Kawasaki (JP); Takeru Yasuda, Kawasaki (JP); Atsunori Terasaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 43 days.

(21) Appl. No.: 16/268,901

(22) Filed: Feb. 6, 2019

(65) Prior Publication Data

US 2020/0227252 A1 Jul. 16, 2020

(30) Foreign Application Priority Data

Feb. 23, 2018 (JP) .................................. 2018-030888
Oct. 29, 2018 (JP) ............................... JP2018-202746

(51) Int. Cl.
*H01L 21/00* (2006.01)
*H01L 21/027* (2006.01)
*H01L 21/02* (2006.01)

(52) U.S. Cl.
CPC ...... *H01L 21/0273* (2013.01); *H01L 21/0206* (2013.01); *H01L 21/0228* (2013.01)

(58) Field of Classification Search
CPC ............. H01L 21/0273; H01L 21/0206; H01L 21/0228; H01L 21/0272; H01L 21/02068
See application file for complete search history.

(56) References Cited

U.S. PATENT DOCUMENTS

| | | | | |
|---|---|---|---|---|
| 3,653,999 A | * | 4/1972 | Fuller | H01L 21/00 438/611 |
| 4,125,440 A | * | 11/1978 | Markovits | G01N 27/42 204/400 |
| 4,963,501 A | * | 10/1990 | Ryan | H01L 21/28587 148/DIG. 111 |
| 5,240,878 A | * | 8/1993 | Fitzsimmons | G03F 7/094 148/DIG. 100 |
| 9,593,424 B2 | | 3/2017 | Nagai et al. | |
| 2012/0129343 A1 | * | 5/2012 | Tamaso | H01L 29/66068 438/685 |
| 2017/0236935 A1 | * | 8/2017 | Ebihara | H01L 29/7815 257/77 |
| 2018/0171226 A1 | * | 6/2018 | Yang | H01L 29/66575 |

FOREIGN PATENT DOCUMENTS

JP 10-172960 A 6/1998
JP 2006-114880 A 4/2006

* cited by examiner

*Primary Examiner* — Richard A Booth
(74) *Attorney, Agent, or Firm* — Venable LLP

(57) ABSTRACT

Provided is a method of forming a film on a substrate including: forming a protective member on a surface of the substrate; forming an organic structure on the surface of the substrate, at a distance from the protective member; removing the protective member after the formation of the organic structure; and forming a film by CVD in a region of the surface of the substrate from which the protective member is removed.

10 Claims, 7 Drawing Sheets

METHOD OF FORMING FILM ON SUBSTRATE AND METHOD OF MANUFACTURING LIQUID EJECTION HEAD

BACKGROUND OF THE INVENTION

Field of the Invention

The present invention relates to a method of forming a film on a substrate and a method of manufacturing a liquid ejection head.

Description of the Related Art

As methods of forming a film on a substrate by a chemical vapor deposition (CVD) method without bias assistance, there are given, for example, a thermal CVD method and an atomic layer deposition (ALD) method. In film formation by those CVD methods, the adhesion of the formed film depends considerably on the state of a substrate surface on which the film is formed. The state of a surface of a substrate varies depending on the substrate's history prior to the formation of a film, and it is therefore difficult in some cases to form a film having a desired level of adhesion. An example of variations in substrate surface state which may affect the adhesion of a film is organic contamination from a residue that remains after the removal of a resist used in a previous step.

An organic contaminant or an organic residue, such as the resist residue, is known to be able to be removed by $O_2$ plasma treatment as the one described in Japanese Patent Application Laid-Open No. H10-172960, or wet cleaning as the one described in Japanese Patent Application Laid-Open No. 2006-114880, in which a mixed liquid of sulfuric acid and a hydrogen peroxide solution is used.

SUMMARY OF THE INVENTION

According to one aspect of the present invention, there is employed the following constitution.

A method of forming a film on a substrate includes: forming a protective member on a surface of the substrate; forming an organic structure on the surface of the substrate, at a distance from the protective member; removing the protective member after the formation of the organic structure; and forming a film by CVD in a region of the surface of the substrate from which the protective member is removed.

Further, according to another aspect of the present invention, there is employed the following constitution.

A method of manufacturing a liquid ejection head includes: a substrate having a first surface and a second surface on a side opposite to the first surface; a liquid supply port through which the first surface and second surface of the substrate communicate with each other; a liquid resistant protective film at least continuous to an inner wall of the liquid supply port and to a part of the first surface; and a member configured to define, on the first surface, a liquid bubble forming chamber in which energy for ejecting a liquid is generated and a liquid flow path along which a liquid is transported from the liquid supply port to the liquid bubble forming chamber, the method including: forming a protective member in a region that is a part of the first surface and that contains a region in which the liquid supply port is opened; forming an organic structure from resin on the first surface at a distance from the protective member, the organic structure being at least a part of the member configured to define the liquid bubble forming chamber and the liquid flow path; forming the liquid supply port in the substrate; removing the protective member; forming the liquid resistant protective film by CVD on the inner wall of the liquid supply port and a region in which the protective member is removed; and patterning so as to leave the liquid resistant protective film formed on the first surface in the region in which the protective member is removed.

Further features of the present invention will become apparent from the following description of exemplary embodiments with reference to the attached drawings.

DESCRIPTION OF THE EMBODIMENTS

In the manufacture of a liquid ejection head, there is a case in which, in order to prevent a substrate made of silicon (Si) from dissolving in an ejected liquid, a liquid resistant protective film is formed on a surface, on which the substrate material is exposed, and which includes a liquid flow path. The liquid resistant protective film is formed by, for example, an atomic layer deposition (ALD) method, which provides high coverage in covering a liquid flow path surface, which is formed on the substrate, and has a complicate shape. An organic residue of resist and other materials used to form the liquid flow path impairs reliability in the adhesion of the liquid resistant protective film formed by ALD, which may cause the peeling of the film and the generation of a pinhole.

On the other hand, a structure made of organic resin, for example, a flow path member forming a flow path, is formed in a substrate for a liquid ejection head in some cases. Low-temperature CVD methods including ALD allow the liquid resistant protective film to be formed with the flow path member or other structures that are made of organic resin (called organic structures) already formed. However, the application of the methods of Japanese Patent Application Laid-Open No. H10-172960 and Japanese Patent Application Laid-Open No. 2006-114880 to the removal of an organic residue may damage an organic structure.

It is therefore an object of the present invention to secure reliability in the adhesion of a film formed by CVD to a surface of a substrate on which an organic structure has already been formed, while minimizing damage to the organic structure. Another object of the present invention is to provide a method of manufacturing a liquid ejection head including this film forming method.

Embodiments of the present invention are described below in detail with reference to the drawings. The embodiments described below, however, are not to limit the scope of the present invention, and are provided in order to fully describe the present invention to persons with ordinary knowledge in the art.

First Embodiment

FIG. 1A to FIG. 1E are diagrams for illustrating a method of forming a film on a substrate, and are schematic sectionals views for illustrating, for each step, the state of the substrate.

Figure 1A:
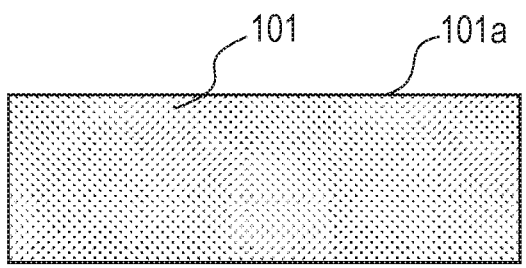
FIG. 1A, FIG. 1B, FIG. 1C, FIG. 1D, and FIG. 1E are schematic sectional views for illustrating, for each step, the state of a substrate fabricated according to one embodiment of the present invention.
Figure 1B:
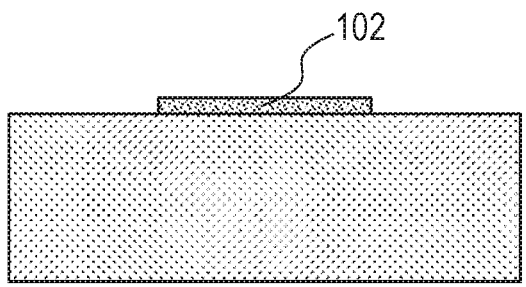

Steps illustrated in FIG. 1A and FIG. 1B are steps of forming a protective member 102 on a prepared substrate 101. First, as illustrated in FIG. 1A, the substrate 101 is prepared. The protective member 102 is formed next on a substrate surface 101a of the substrate 101. Examples of a material suitable for the substrate 101 include silicon, gallium arsenide, gallium nitride, and alumina. The protective member 102 can be formed by applying a general semiconductor process. The material of the protective member is required to be removable in a later step, and also has other requirements, which are described later. The surface of the substrate 101 on which the protective member 102 is to be formed may be cleaned in a step prior to the formation of the protective member 102.

Figure 1C:
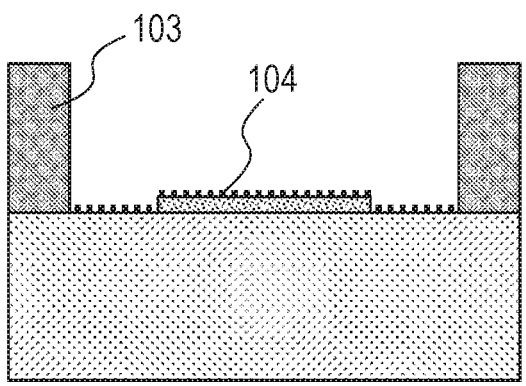

A step illustrated in FIG. 1C is a step of executing substrate processing, which includes a step of forming an organic structure 103 made of organic resin. The organic structure 103 is formed at a distance from the protective member 102. The organic structure 103 in some cases is given a function as a structure by using a material high in mechanical strength, for example, epoxy resin. When photosensitive resin is used as a material for forming the organic structure 103, the organic structure 103 can be formed in a desired pattern merely by exposing and developing the material. The substrate processing includes, for example, the formation of a step (not shown) in the substrate by forming a mask with the use of a photoresist and performing etching to strip the mask. An organic residue 104 is a residue present on a development surface of the organic structure or a residue remaining after the stripping of the photoresist in the substrate processing, or is generated because of insufficient cleaning of a chemical used in the stripping. It is common to form the organic structure by a method that includes coating, mostly spin coating, when a general semiconductor process is to be used. Spin coating may have difficulties in applying an organic material evenly when a step is formed in the substrate in the substrate processing or for other reasons. In that case, the organic structure may be formed before unevenness is formed in the substrate.

Figure 1D:
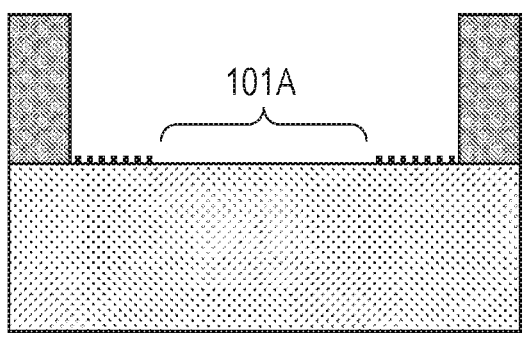

A step of removing the protective member 102 is illustrated in FIG. 1D. The protective member 102 is removed selectively with respect to the organic structure 103.

With the removal of the protective member 102, the organic residue 104 is removed as well from a region 101A of the substrate surface 101a in which the protective member 102 has been formed, to thereby expose a clean surface not subjected to the step of forming the organic structure 103 and the substrate processing step.

The material and removal method of the protective member are described.

One of properties required of the protective member is selective removability in a later step. That is, the protective member is required to inflict minimum damage that causes the substrate and the structure around the protective member to lose their functions when the protective member is removed, and is required to sustain as little loss as possible in the processing of the organic structure and the substrate. Any material that meets the requirements can therefore be employed for the protective member. The thickness of the protective member is not particularly limited as long as the requirements described above are met. However, removal of the protective member that is too thick takes long. A preferred thickness of the protective member is 10 nm or more and 5 µm or less. A method generating as little organic residue as possible is chosen to remove the protective member. For example, a method in which the protective member is made from an inorganic material and is removed by a chemical containing no organic matter is chosen. Specifically, a protective member that is a film containing silicon and at least one of oxygen, nitrogen, and carbon can be removed by wet etching using buffered hydrofluoric acid. A protective member that is a film of a titanium-tungsten alloy can be removed by wet etching using a hydrogen peroxide aqueous solution.

As the protective member is formed before the formation of the organic structure, the protective member is not limited to particular forming methods, and may be formed by various methods suitable for its material, for example, thermal CVD and sputtering, in which a relatively high temperature is used.

When the protective member is removed by the wet etching methods described above, it is preferred to remove the protective member by flowing an etchant over the substrate. The organic residue is not dissolved in the etchant but is floated away by the dissolving of the protective member. Accordingly, the organic residue is actively discharged to the outside of the substrate by flowing the etchant, and is prevented from re-adhering to the surface on which the protective member has been disposed. The flowing state of the etchant may be ensured with the use of a centrifugal force from rotation by holding the substrate (wafer) to a rotatable table and dripping the etchant while rotating the table. In another method that may be employed, a chemical bath provided with an inlet and an outlet for a chemical is prepared, a constant flow rate is set, and the wafer is immersed in the chemical bath. The chemical flown over the substrate may be heated to accelerate the removal of the protective member. The temperature, at which the chemical is heated, may be lower than the boiling point of the chemical so as to cause little loss of etching components.

Figure 1E:
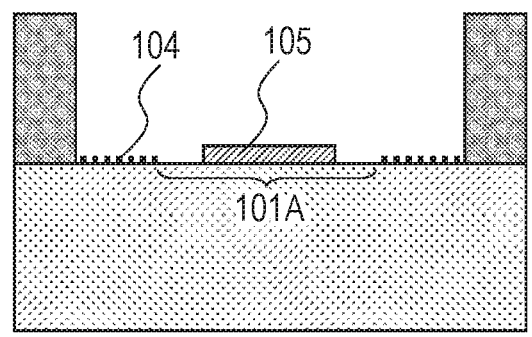

A step illustrated in FIG. 1E is a step of forming a film 105 by CVD in the region 101A (the region in which the protective member has been present) from which the protective member has been removed. A surface to which the film 105 is adhered is within the region in which the protective member 102 has been present and has no organic residue, and a high reliability in adhesion is accordingly obtained. The film 105 is formed by CVD under a condition that does not damage the organic structure 103. Specifically, the film 105 is formed at a temperature lower than the upper temperature limit of the organic structure. When the organic structure 103 has an upper limit temperature of 300° C., for instance, the film 105 is formed at a temperature well below 300° C., for example, 250° C. or lower. Atomic layer deposition (hereinafter abbreviated as ALD) allows a film to be formed at a relatively low temperature, and also is high in coverage. Plasma CVD, too, allows a film to be formed at a low temperature. When the film is formed under a condition in which oxygen plasma is generated at a relatively high temperature, the organic structure may be damaged. The film 105 is not limited particularly as long as a desired film is formed by CVD. Examples of the film 105 include a film containing silicon and at least one of oxygen, nitrogen, and carbon, a titanium oxide film, an aluminum oxide film, and other metal oxide films, and a titanium nitride film, an aluminum nitride film, and other metal nitride films.

A step of removing organic matter from the substrate surface may additionally be provided before the step of FIG. 1B, in which the protective member is formed. In the present invention, the protective member is formed to protect a region in which a film is to be formed later by CVD, in particular, a region in which it is important to secure reliability in adhesion, during steps in which an organic residue is generated, and is removed before the film is formed by CVD to expose a clean surface. It is therefore undesirable for the substrate surface to have an organic residue before the protective member is formed. Because the organic structure is not formed yet, a method highly effective in removing organic matter may be chosen, for example, the $O_2$ plasma treatment method described in Japanese Patent Application Laid-Open No. H10-172960, or the wet cleaning treatment method described in Japanese Patent Application Laid-Open No. 2006-114880. Organic matter may also be removed by scraping a few nm off the substrate surface through sputtering using argon gas when physical damage is tolerable.

Second Embodiment

FIG. 2A to FIG. 2H are schematic sectionals views for illustrating, for each step, the state of a liquid ejection head manufactured according to the present invention. A second embodiment of the present invention is described through a specific example.

Figure 2A:
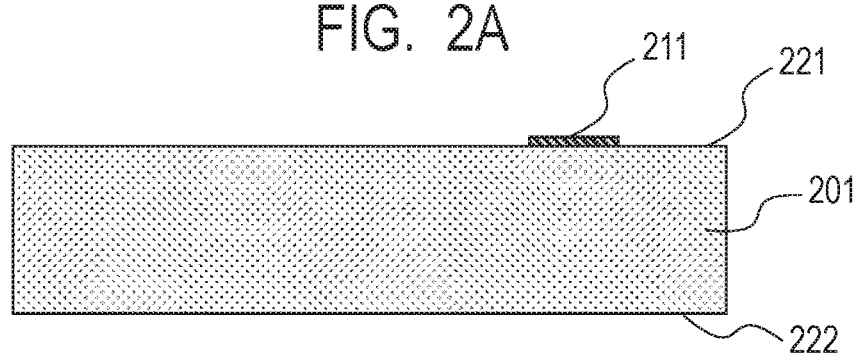
FIG. 2A, FIG. 2B, FIG. 2C, FIG. 2D, FIG. 2E, FIG. 2F, FIG. 2G, and FIG. 2H are schematic sectional views for illustrating, for each step, the state of a liquid ejection head manufactured according to one embodiment of the present invention.

A substrate 201 for a liquid ejection head is illustrated in FIG. 2A. The substrate 201 for a liquid ejection head has a first surface 221 and a second surface 222. A heat generating resistor 211, which is an element configured to generate energy for ejecting liquid, is disposed on the first surface 221. The second surface 222 is a surface of the substrate 201 for a liquid ejection head on the side opposite to (facing) the first surface 221.

Figure 2B:
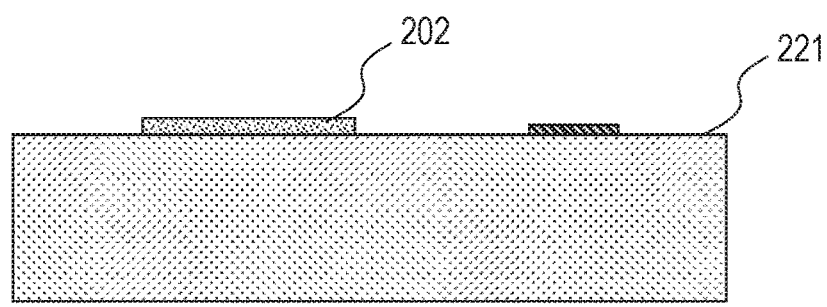

In FIG. 2B, a protective member 202 is formed on the first surface 221 in a region that is a part of the first surface and that is to have an opening later to form a liquid supply port. For example, a silicon oxide film is formed to have a thickness of 100 nm as the protective member. An organic residue to be adhered to the first surface 221 when the heat generating resistor 211 is formed is removed to clean the first surface 221 before the protective member 202 is formed. The protective member 202 is formed in the partial region of the first surface 221 that contains a region in which the liquid supply port described later is to be opened. The region in which the protective member is formed is a region set apart from an organic structure, which is formed next, and spreading substantially evenly around an opening portion of the liquid supply port. When the protective member 202 is patterned, an organic residue may adhere to the first surface 221. However, a part of the first surface 221 that is under the protective member is protected against the adhering of the organic residue and may also be cleaned because the organic structure has not yet been formed. The removal of the organic residue may be omitted as long as the organic residue causes no trouble in the formation of the organic structure.

Figure 2C:
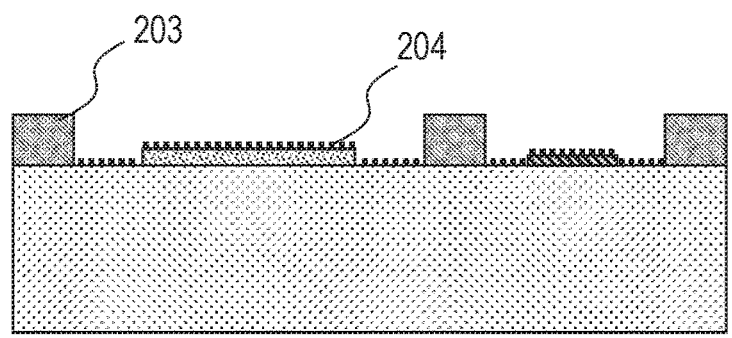

In FIG. 2C, an organic structure 203 is formed on the first surface as a part of a member made from a resin material to define a liquid bubble forming chamber and a liquid flow path. The organic structure is formed first as an adhesion layer used when a flow path forming member is formed later. It is preferred to form the adhesion layer thin and even at a stage where no significant unevenness is present in the substrate. The adhesion layer is formed by, for example, evenly applying photosensitive epoxy resin to a thickness of 1 μm by spin coating or other methods, and performing photolithography to pattern the resin coat. At this point, an organic residue 204 adheres to the first surface 221 of the substrate and to the protective member 202.

Figure 2D:
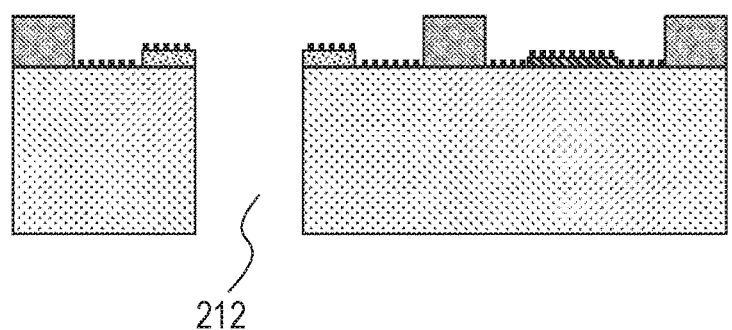

A liquid supply port 212 is formed in FIG. 2D.

The liquid supply port 212 is formed by applying a photoresist (not shown) to the first surface 221 of the substrate 201, exposing and developing the photoresist to form a mask pattern with which an opening is to be formed above the protective member 202, and then performing etching. Reactive ion etching (RIE) is preferred for the etching in this step. When the substrate is made of silicon, in particular, the Bosch process in which deposition steps and etching steps are alternated to etch silicon deep may be employed for the etching.

After the etching, the photoresist mask is stripped and a residue remaining after the stripping may add to the deposit as the organic residue 204. In the case of using the Bosch process described above, a film formed in the deposition steps and re-adhering may add to the deposit as the organic residue 204. There is also a case in which insufficient cleaning of a stripping solution used to strip the resist or the film formed in the deposition steps produces the organic residue 204. In this case, too, the part around the opening portion of the liquid supply port 212 on the first surface side is protected by the protective member 202 to prevent the organic residue from adhering to the part. While an example of forming the liquid supply port 212 by etching from the first surface is illustrated in FIG. 2D, the present invention is not limited thereto. For instance, etching may be started from the second surface 222 of the substrate to be ended with the protective member left as an etching stopper. The liquid supply port 212 may also be formed by etching from both of the substrate's first surface and second surface.

Figure 2E:
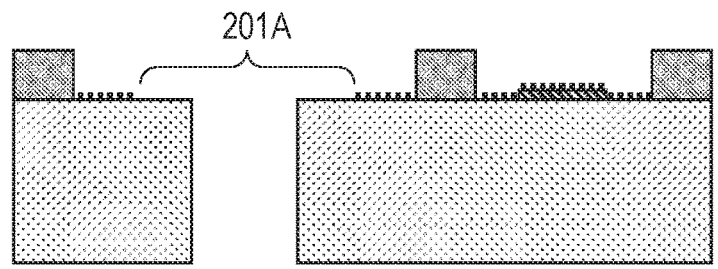

A step of removing the protective member 202, which has been formed on the first surface, is illustrated in FIG. 2E.

This removes the organic residue 204 as well from a region (201A), in which the protective member 202 has been formed, to thereby expose a clean surface not subjected to the step of forming the organic structure and the step of forming the liquid supply port. Because an example of using a silicon oxide film as the protective member 202 is described here, the protective member 202 is removed by, for example, fixing the wafer to a rotatable table, and dripping buffered hydrofluoric acid as a remover chemical onto the center of the wafer while rotating the table at a rate of 1,000 rpm, so that the remover chemical is flicked toward the rim of the wafer.

The protective member may be formed so as to cover the heat generating resistor 211 as well. In this case, the organic residue 204 that remains on a surface of the heat generating resistor may also be removed, which helps to stabilize ejection unevenness when a liquid is ejected by heating the heat generating resistor, and fluctuations in the life span of the resistor.

When the material of the protective member is a film of a titanium-tungsten alloy, a part of the protective member that is left in a terminal formed on the first surface for electric connection to the outside, for example, a pad (not shown) for exchanging signals, may be utilized as a part of the pad. When the pad is made of aluminum and wiring through which an electric signal is sent to the outside is made of gold, for example, the remaining protective member may have an additional function as a film for preventing the metals from diffusing. When the protective member is to be partially left as a part of the material of the pad, a resist or the like is used to protect the part of the protective member against the removal in the step of removing the protective member.

The removal of the protective member 202 creates a state in which the first surface and the second surface are communicated with each other even in the case in which the protective member has been left as an etching stopper.

Figure 2F:
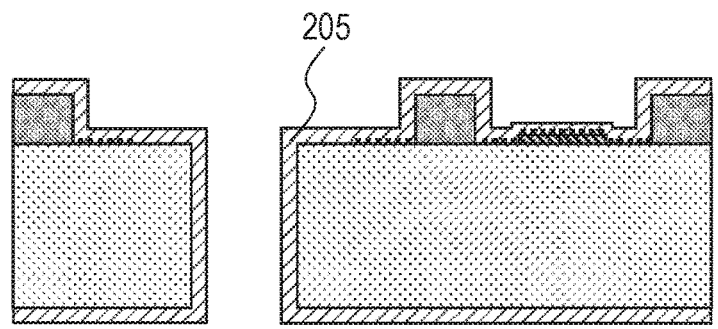

A step of forming a liquid resistant protective film 205 by CVD is illustrated in FIG. 2F.

The liquid resistant protective film is preferred to be formed on an inner wall of the liquid supply port as well, and may be formed on the entire surface of the second surface. ALD high in coverage is a preferred method of forming the liquid resistant protective film 205. When ALD is used, the liquid resistant protective film 205 is formed on both the first surface and the second surface, which are surfaces of the substrate, including the inner wall of the liquid supply port, unless a measure to prevent the formation of a coat is purposely taken.

A titanium oxide film, a tantalum oxide film, or a similar film may be used as the liquid resistant protective film 205. For example, when a titanium oxide film is formed as the liquid resistant protective film 205 by ALD, the substrate temperature is set to 100° C., titanium tetrachloride and water (water vapor) are introduced alternately as a film forming gas, and this cycle is repeated until the titanium oxide film is formed to have a desired thickness. The organic structure 203 is not damaged at this film forming temperature and may retain its shape.

Figure 2G:
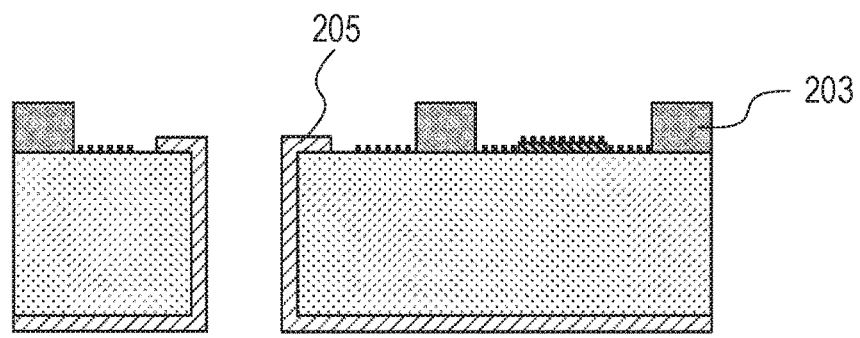

A step illustrated in FIG. 2G is a step of removing a part of the liquid resistant protective film that is formed on the first surface from around the liquid supply port, that is, a step of removing (patterning) a part of the liquid resistant protective film from a surface that is not the region in which the protective member has been removed. While dry etching and wet etching both are employable for the patterning, wet etching, which damages the organic structure little, is preferred. The liquid resistant protective film is weaker in adhesion and easier to be removed above the organic structure and in a part to which the organic residue has adhered than on the surface on which the protective member has been formed and which has no organic residue. It is preferred in the patterning using wet etching to avoid a contact between a part of the liquid resistant protective film that is formed on the inner wall of the liquid supply port and an etchant by blocking the opening with a resist or the like.

In other words, an adhesion surface of the liquid resistant protective film that is formed in the region in which the protective member has been disposed is a region in which the protective member has been present with no organic residue, and has an accordingly high reliability in adhesion. The liquid resistant protective film is only required to be formed in a continuous manner on the inner wall of the liquid supply port and at least a part of the first surface, and may not be formed on the second surface. It is preferred for the liquid resistant protective film to be formed in a continuous manner on the inner wall of the liquid supply port and the second surface as well. In a state preferred when the adhesion is taken into account, the organic residue is absent also on the inner wall of the liquid supply port and the second surface on which the liquid resistant protective film is formed.

Figure 2H:
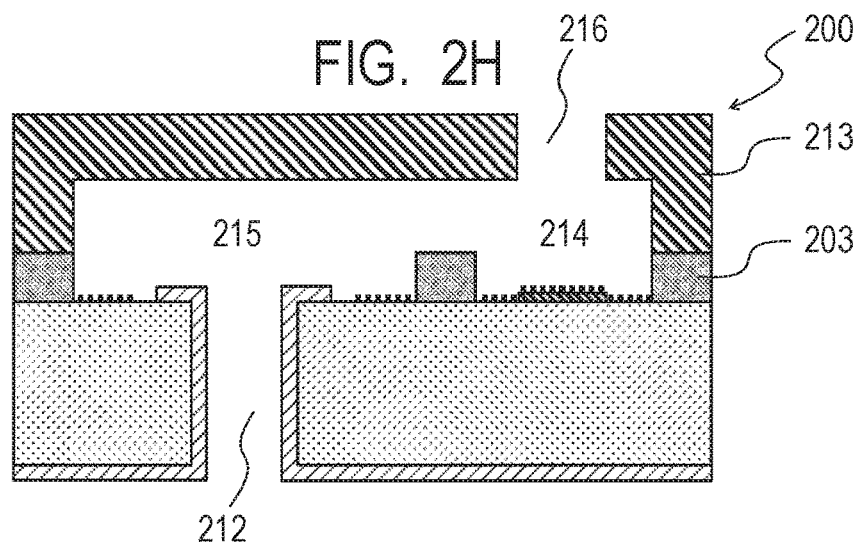

Lastly, a flow path forming member 213 is disposed with the organic structure 203 as an adhesion layer, and liquid bubble forming chamber 214, a liquid flow path 215 along which a liquid is transported from the liquid supply port to the liquid bubble forming chamber, and an ejection orifice 216 are formed to manufacture a liquid ejection head 200. FIG. 2H is a diagram of the completed liquid ejection head 200.

The flow path forming member 213 may be formed by a known method. In an example of the known method, a first resin layer is formed from a photosensitive resin material, a pattern for the liquid bubble forming chamber 214 and the liquid flow path 215 is formed, a second resin layer, in which the ejection orifice 216 is to be formed, is formed above the pattern, and then the ejection orifice is formed.

Third Embodiment

A mode in which a protective member is partially left instead of being removed entirely is described next.

Figure 3A:
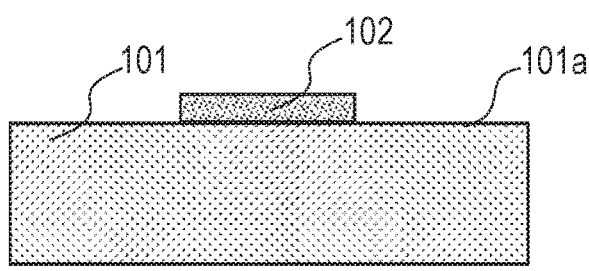
FIG. 3A, FIG. 3B, FIG. 3C, FIG. 3D, and FIG. 3E are schematic sectional views for illustrating a configuration to be improved in a third embodiment of the present invention.
Figure 3B:
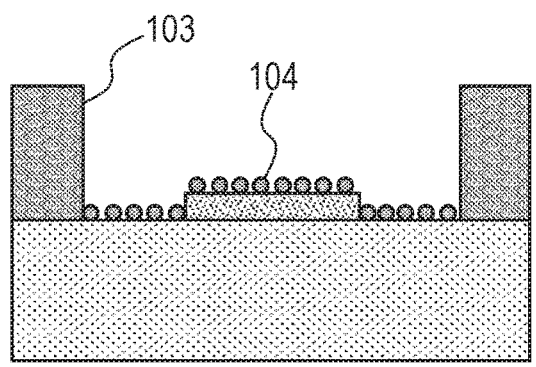
Figure 3C:
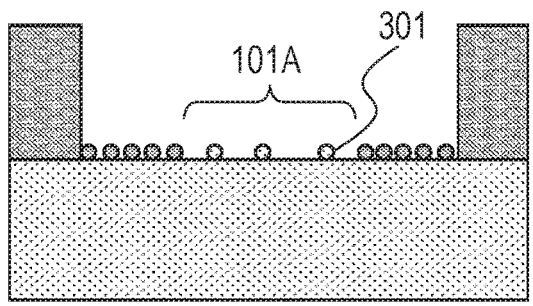
Figure 3D:
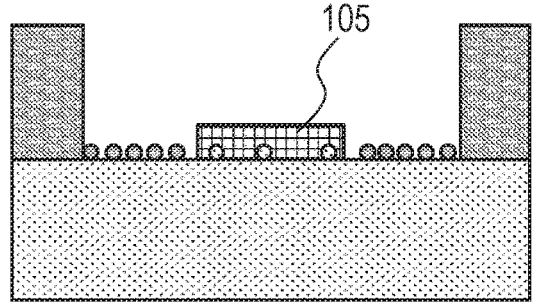
Figure 3E:
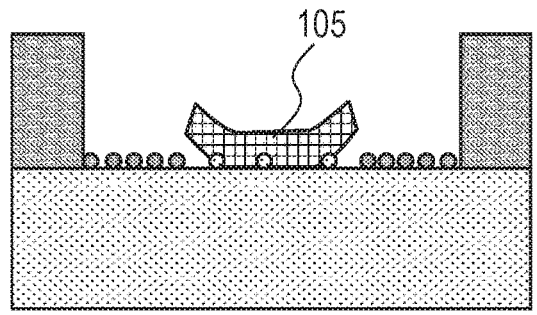

When surface contamination from an organic residue is considerable, the removal of the protective member 102 is not enough to remove a residue 301 completely (FIG. 3C). The residue 301 in this case fills a space at the boundary between the substrate surface 101a and the liquid resistant protective film 105 (FIG. 3D), and the resultant drop in adhesion may cause the liquid resistant protective film 105 to peel (FIG. 3E). This is likely to happen when the formation of the liquid resistant protective film 105 is based on a thermal CVD reaction as in ALD.

ALD involves such a reaction as typified by an example is illustrated in FIG. 4A to FIG. 4E. This is a reaction in which $TiCl_4$ is used as a precursor and $H_2O$ is used as an oxidant.

Figure 4A:
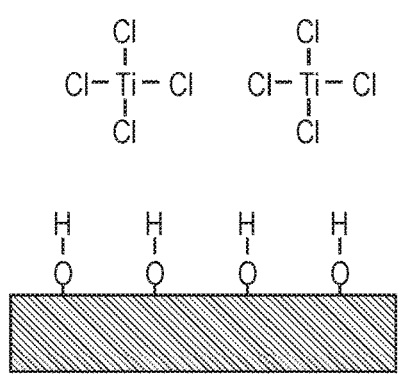
FIG. 4A, FIG. 4B, FIG. 4C, FIG. 4D, and FIG. 4E are schematic sectional views for illustrating film forming states in ALD applied to the third embodiment.
Figure 4B:
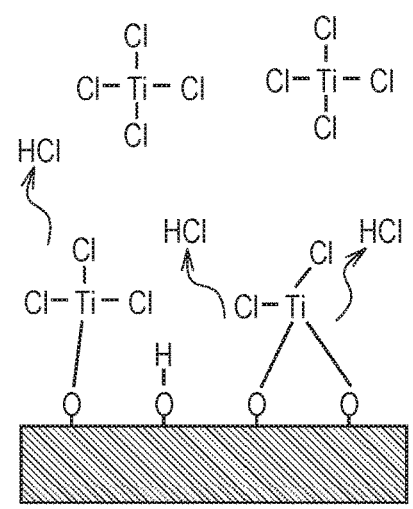
Figure 4C:
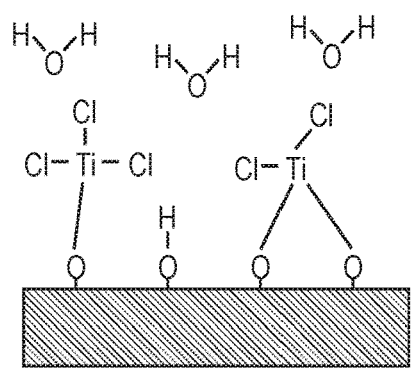
Figure 4D:
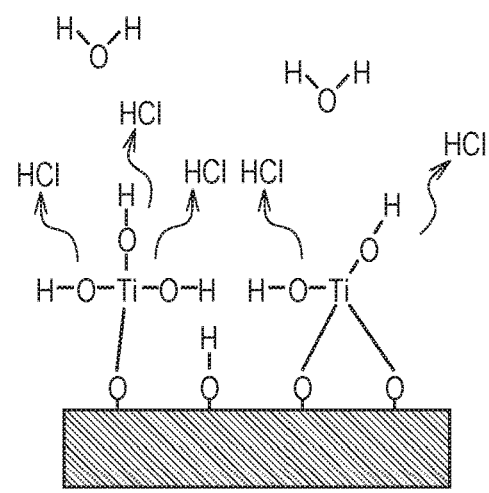
Figure 4D:
Figure 4E:
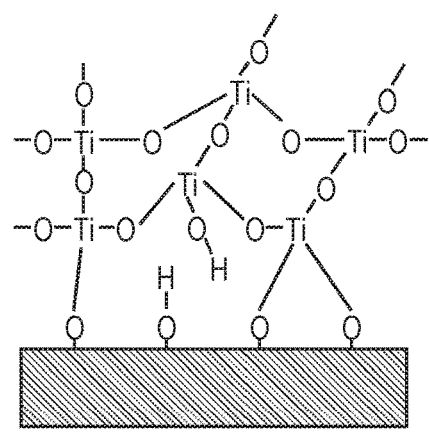

(1) $TiCl_4$ is introduced to the substrate surface (FIG. 4A).
(2) An OH group on the substrate surface reacts with Cl in $TiCl_4$, thereby forming a Ti—O bond while desorbing HCl (FIG. 4B).
(3) After the reaction product HCl and $TiCl_4$ unreacted with the substrate are exhausted, $H_2O$ is introduced (FIG. 4C).
(4) An unreacted Cl group in $TiCl_4$ bonded to the substrate in the step (2) reacts with $H_2O$, thereby forming an OH group while desorbing HCl (FIG. 4D).
(5) After the reaction product HCl and $H_2O$ unreacted with the substrate are exhausted, the steps (1) to (4) are repeated to cause the film forming progress (FIG. 4E).

When an OH group is not present on the substrate surface in the step (2), $TiCl_4$ is deposited on the surface by physical absorption, namely, intermolecular force alone, and the reaction progresses from the state to form a film. The adhesion in this case is considerably weaker than that of a bond formed by a thermal CVD reaction via an OH group. In other words, when the material of the substrate surface is not liable to form an OH group, it tends to be difficult to secure the adhesion of a film formed by ALD. When an organic residue fails to be removed completely in this combination, the effective surface area contributing to the adhesion decreases, and the adhesion drops to a problematic level.

Steps illustrated in FIG. 5A to FIG. 5F are effective for this case.

Figure 5A:
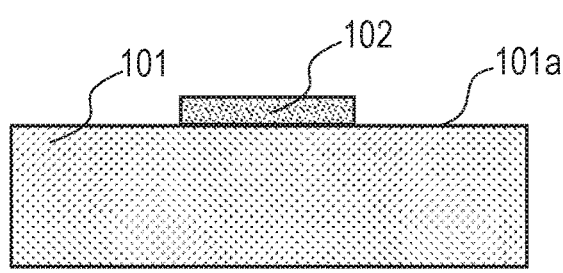
FIG. 5A, FIG. 5B, FIG. 5C, FIG. 5D, FIG. 5E, and FIG. 5F are schematic sectional views for illustrating, for each step, the state of a substrate fabricated in the third embodiment.
Figure 5B:
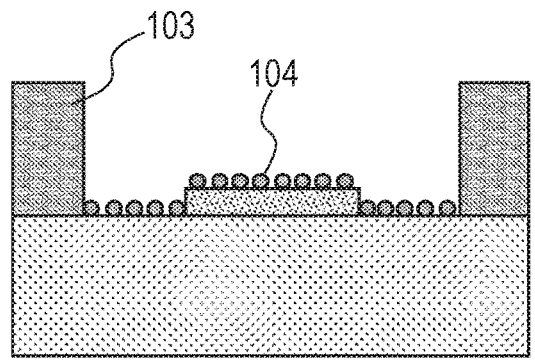
Figure 5C:
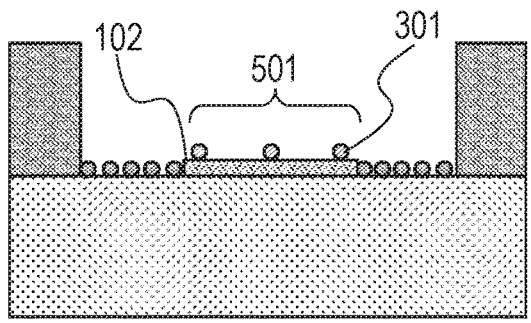
Figure 5D:
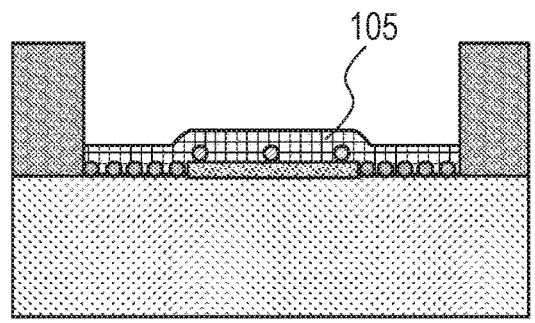

FIG. 5A and FIG. 5B are the same as FIG. 1A to FIG. 1C. In FIG. 5C, however, the protective member 102 is partially left in a film thickness direction instead of being removed entirely. A surface of the protective member 102 in this step is denoted by 501. The liquid resistant protective film 105 is formed in this state. The organic residue 301 failed to be removed fills a space between the surface 501 of the protective member and the liquid resistant protective film 105 (FIG. 5D).

A material compatible with ALD, namely, a material easy to form an OH group, is selected for the protective member 102 in the third embodiment. The substrate surface 101a is not contaminated from an organic residue at the time the protective member 102 is formed, and satisfactory adhesion may accordingly be maintained even when such a thermal CVD reaction as in ALD takes place. Stronger adhesion may be secured with sputtering, plasma CVD, and other film forming methods that involve physical energy.

The use of a material easy to form an OH group as the material of the protective member 102 provides strong adhesion to the surface 501 of the protective member even when the liquid resistant protective film 105 is formed next by ALD. Despite the reduction of the effective surface area that contributes to adhesion due to the organic residue 301 filling the space at the boundary, this prevents the boundary from peeling readily.

Figure 5E:
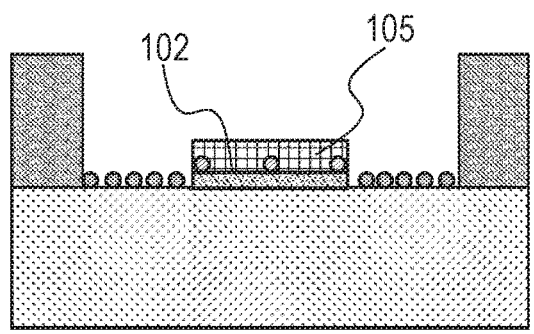
Figure 5F:
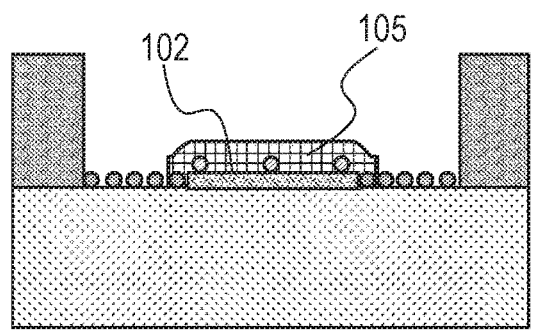

The liquid resistant protective film 105 may be patterned in two ways: one is to etch the liquid resistant protective film 105 to the edge of the protective member 102 or inside the edge of the protective member 102 (FIG. 5E), and the other is to etch the liquid resistant protective film 105 outside the edge of the protective member 102 (FIG. 5F). In the case of FIG. 5E, the protective member 102 is present throughout the boundary between the liquid resistant protective film 105 and the substrate surface 101a, thereby securing adhesion. In the case of FIG. 5F, on the other hand, the liquid resistant protective film 105 beyond the edge of the protective member 102 may peel. The edge, however, serves as a stopper and the liquid resistant protective film 105 behind the edge does not peel.

In the manufacture of the liquid ejection head according to the third embodiment, the liquid resistant protective film 105 is formed for the purpose of preventing erosion due to an ejected liquid. It is therefore preferred to give liquid resistance to the protective member 102 as well when the protective member 102 is to be partially left. Otherwise, the protective member 102 is eroded from the boundary between the stacked layers in the case of FIG. 5E. In the case of FIG. 5F, the protective member 102 is seemingly protected by the liquid resistant protective film 105, but partial peeling of the boundary between the liquid resistant protective film 105 and the substrate surface 101a is expected as described above. When the partial peeling allows the ejected liquid to reach the edge of the protective member 102, the erosion begins. In any one of the cases, there is a possibility that the liquid resistant protective film 105 peels when the material of the protective member 102 is not resistant to the ejected liquid.

This problem regarding adhesion is likely to be avoidable when the liquid resistant protective film 105 is formed by a film forming method involving physical energy, instead of ALD or other thermal CVD methods. However, ADL, which is high in coverage, is favorable when side walls of a structure having a recess or a pierced portion in a substrate as in FIG. 2A to FIG. 2H are to be protected completely. The third embodiment is more effective in such cases.

In an example of a combination for reproducing the third embodiment, a material difficult to form an OH group, for example, SiC or SiCN, is used for the substrate surface, and a material easy to form OH groups that is a metal compound containing oxygen, for example, SiO, SiON, SiOC, TiO, or TaO, is used for the protective member 102. A suitable film forming method may be selected from ALD, sputtering, plasma CVD, and the like. In the case of application to a liquid ejection head, however, SiO and SiON are not so favorable in terms of resistance to an ejected liquid. The liquid resistant protective film 105 may be a film made of metal oxide, for example, TiO, TaO, or SiOC, and formed by ALD.

Fourth Embodiment

The removal of the protective member 102 of FIG. 1D fails to remove the organic residue 104 illustrated in FIG. 1C as desired in some cases. This is because the organic residue 104 itself is not dissolved in the enchant for removing the protective member 102, and is removed mainly by a tearing action in which the removal of the protective member 102 causes the organic residue 104 to detach from the substrate 101. The organic residue 104 accordingly remains, despite the removal of the protective member 102, on the clean surface to be exposed, when the cohesive force or mechanical strength of the organic residue 104 is strong.

In such cases, a step of actively removing the organic residue 104 may be added before the step of removing the protective member 102.

Figure 6A:
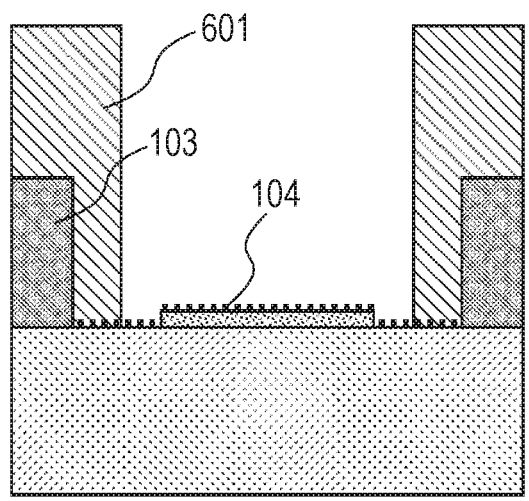
FIG. 6A, FIG. 6B, FIG. 6C, and FIG. 6D are schematic sectional views for illustrating, for each step, the state of a substrate fabricated in a fourth embodiment of the present invention.

Steps of removing the organic residue 104 are illustrated in FIG. 6A to FIG. 6D. FIG. 6A is a continuation from FIG. 1C, and a mask member 601 is formed in FIG. 6A so as to expose the protective member 102. The mask member 601 may be formed from a positive photoresist used in a general semiconductor process, has a thickness of 0.5 µm to 10 µm, and may be patterned by exposure and development.

Figure 6B:
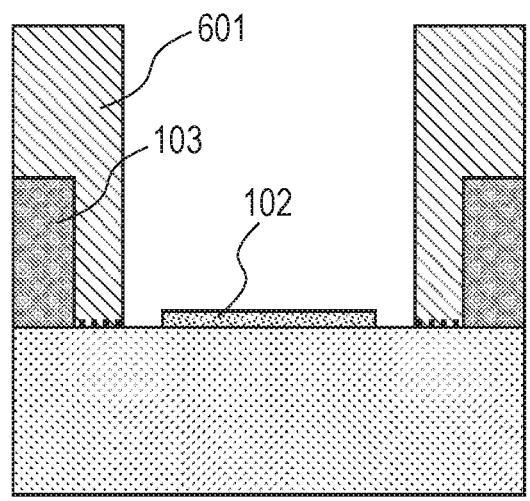

As illustrated in FIG. 6B, the organic residue 104 on the exposed surface of the protective member 102 is removed next. Any removal method may be used as long as the exposed organic residue 104 may be removed while retaining the formed mask member remains, but plasma etching using $O_2$ gas as a main component is preferred. Although the mask member 601 is partially etched, the organic structure 103 is protected by the mask member 601.

Figure 6C:
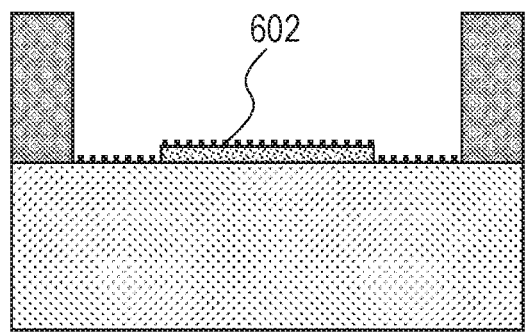

As illustrated in FIG. 6C, the remaining mask member 601 is removed next. It is required to remove the mask member without damaging the already formed organic structure 103. An amine-based stripping solution is preferred when the organic structure is made of epoxy resin and the mask member is formed from a positive photoresist used in a general semiconductor process.

Figure 6D:
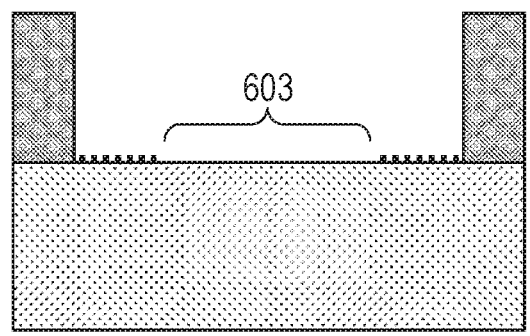

When a stripping solution or the like is used to strip the mask member, a minute amount of organic contaminant (organic residue) 602 re-adheres to the surface of the protective member 102 in actuality. However, contamination from the organic contaminant 602 is very light compared to one caused by the initially present organic residue 104. Consequently, as illustrated in FIG. 6D, the minute amount of organic contaminant (organic residue) 602 is readily removed by the removal of the protective member 102, and a clean surface may be exposed in a region 603.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-030888, filed Feb. 23, 2018, and Japanese Patent Application No. 2018-202746, filed Oct. 29, 2018, which are hereby incorporated by reference herein in their entirety.

What is claimed is:

1. A method of manufacturing a liquid ejection head including: a substrate having a first surface and a second surface on a side opposite to the first surface; a liquid supply port through which the first surface and second surface of the substrate communicate with each other; a liquid resistant protective film at least continuous to an inner wall of the liquid supply port and to a part of the first surface; and a member configured to define, on the first surface, a liquid bubble forming chamber in which energy for ejecting a liquid is generated and a liquid flow path along which a liquid is transported from the liquid supply port to the liquid bubble forming chamber, the method comprising:
forming a protective member in a region that is a part of the first surface and that contains a region in which the liquid supply port is opened;
after the forming of the protective member, disposing an organic structure from a resin on the first surface at a distance from the protective member, the organic structure being at least a part of the member configured to define the liquid bubble forming chamber and the liquid flow path;
forming the liquid supply port in the substrate;
removing the protective member;
forming the liquid resistant protective film by CVD on the inner wall of the liquid supply port and a region in which the protective member is removed; and
patterning so as to leave the liquid resistant protective film formed on the first surface in the region in which the protective member is removed.

2. The method according to claim 1, further comprising, before the forming of the protective member, cleaning the first surface of the substrate on which the protective member is formed.

3. The method according to claim 1, wherein the liquid resistant protective film is formed by an atomic layer deposition method.

4. The method according to claim 1, wherein the organic structure comprises a photosensitive resin.

5. The method according to claim 1,
wherein the protective member is a film containing silicon and at least one selected from a group consisting of oxygen, nitrogen, and carbon, and
wherein the protective member is removed by using a buffered hydrofluoric acid.

6. The method according to claim 1,
wherein the protective member comprises an alloy film including titanium and tungsten, and
wherein the protective film is removed by using a hydrogen peroxide aqueous solution.

7. The method according to claim 1, wherein the protective member includes a metal compound containing oxygen.

8. The method according to claim 1,
wherein the substrate has a heat generating resistor on the first surface, and
wherein the forming formation of the protective member comprises forming the protective member so as to cover the heat generating resistor.

9. The method according to claim 1, wherein, the removing of the protective member comprises leaving a part of the protective member in a film thickness direction.

10. The method according to claim 8, wherein the protective member is resistant to an ejected liquid.

* * * * *